(12) United States Patent
Seshan

(10) Patent No.: US 6,521,996 B1
(45) Date of Patent: Feb. 18, 2003

(54) BALL LIMITING METALLURGY FOR INPUT/OUTPUTS AND METHODS OF FABRICATION

(75) Inventor: Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,956

(22) Filed: Jun. 30, 2000

(51) Int. Cl.$^7$ ................................................ H01L 23/48
(52) U.S. Cl. ...................... 257/737; 428/624; 438/18; 438/108
(58) Field of Search ............................ 357/67; 257/766; 204/192.2; 428/624

(56) References Cited

U.S. PATENT DOCUMENTS

| | | | |
|---|---|---|---|
| 4,737,839 A | * | 4/1988 | Burt .............................. 257/691 |
| 5,175,609 A | * | 12/1992 | DiGiacomo et al. ........ 257/766 |
| 5,891,756 A | | 4/1999 | Erickson |
| 5,900,126 A | * | 5/1999 | Nelson et al. .............. 148/218 |
| 6,162,652 A | | 12/2000 | Dass et al. |
| 6,312,830 B1 | * | 11/2001 | Li et al. ...................... 257/750 |

FOREIGN PATENT DOCUMENTS

| | | |
|---|---|---|
| JP | 2000 091369 | 3/2000 |
| WO | WO 99 34423 | 7/1999 |

OTHER PUBLICATIONS

International Search Report PCT/US01/18666 Aug. 6, 2001.

* cited by examiner

Primary Examiner—David Nelms
Assistant Examiner—Mai-Huong Tran
(74) Attorney, Agent, or Firm—Blakely, Sokoloff, Taylor & Zafman LLP

(57) ABSTRACT

The present invention is an input/output for a device and it method of fabrication. The input/output of the present invention comprises a bond pad having a ball limiting metallurgy (BLM) formed thereon and a bump formed on the ball limiting metallurgy (BLM). In an embodiment of the present invention the ball limiting metallurgy comprises a first film comprising nickel, vanadium, and nitrogen. In the second embodiment of the present invention the bump limiting metallurgy includes a first alloy film comprising a nickel-niobium alloy.

14 Claims, 5 Drawing Sheets

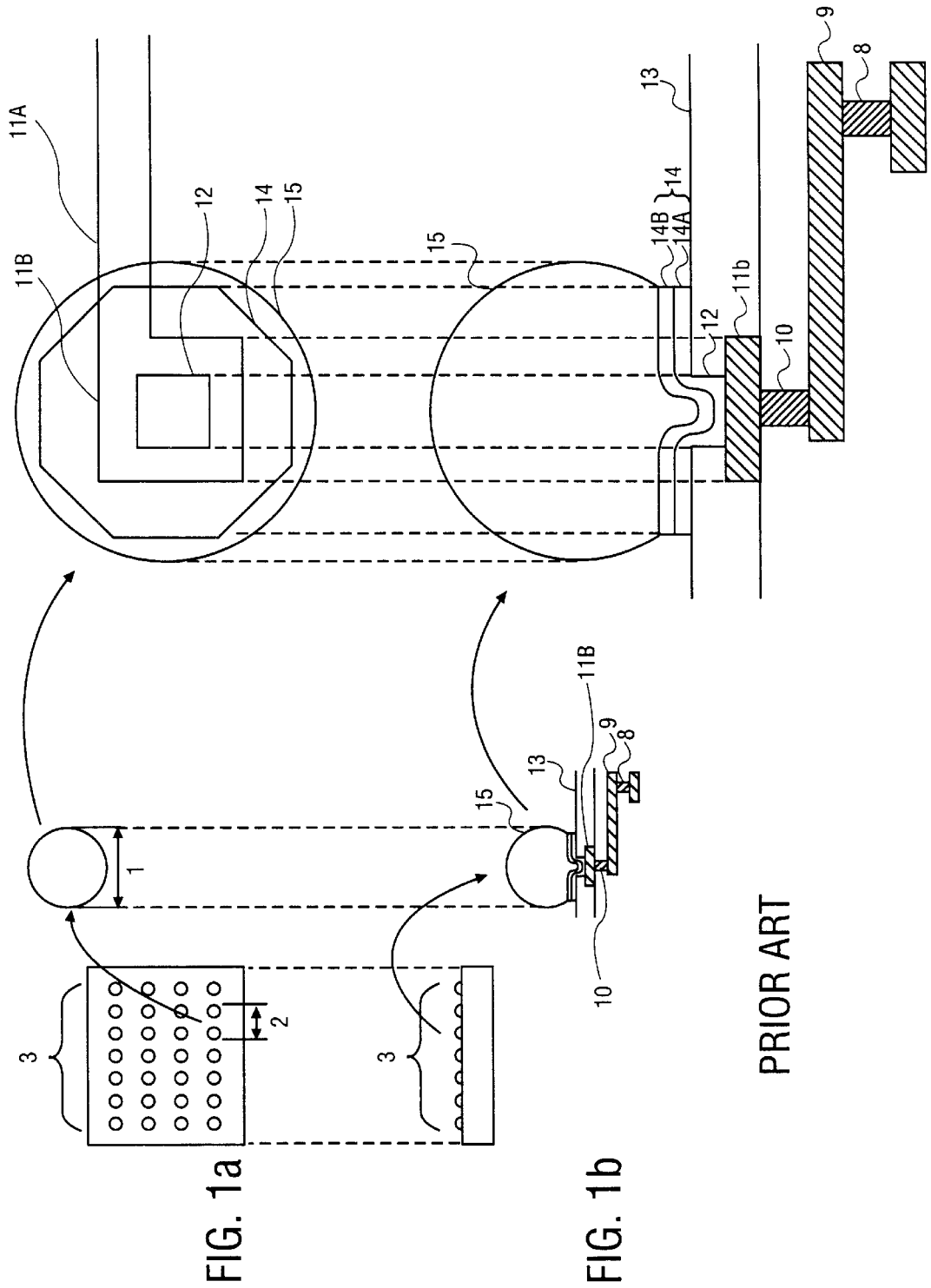

BALL LIMITING METALLURGY FOR INPUT/OUTPUTS AND METHODS OF FABRICATION

BACKGROUND OF THE INVENTION

1. Field of the Invention

The present invention relates to the field of semiconductor Integrated Circuits (IC), and more specifically, to a bump limiting metallurgy (BLM) for input/output of a device.

2. Discussion of Related Art

Input/outputs are used in a device to condition and distribute power, ground, and signals. The I/Os can be wirebonded to a package or board with leads formed from Gold (Au) or Copper (Cu) wire. However, when the number of I/Os reaches about 400 to 1000, bumping often becomes more advantageous than wirebonding.

FIG. 1(a) and FIG. 1(b) show a solder bump 15 with a diameter 1 and a pitch 2. The solder bump 15 is formed on Ball Limiting Metallurgy (BLM) 14. BLM is also known as Pad Limiting Metallurgy (PLM) or Under Bump Metallurgy (UBM). The BLM 14 is connected through a via 12 in the passivation layer 13 to an underlying bond pad 11b. The passivation layer 13, comprises one or more layers of materials, such as silicon oxide, silicon nitride, or polyimide, which act as a barrier to moisture, ions, or contaminants. The bond pad 11b is a widened portion of a metal line 11a in the top metal layer of the device. The line 11a is connected to an underlying via 10 that is, in turn, connected to an underlying line 9. A device typically has 2 to 8 metal layers so a via and a line are alternated vertically until electrical contact is made to the desired part of the IC or the substrate below.

Bumping can significantly improve access to the core area and maximize utilization of the silicon area. FIG. 1(a) and FIG. 1(b) show an areal array 3 of bumps 15 across the entire active area of the chip. The array 3 is substantially periodic and may be face-centered cubic or hexagonal to achieve a higher density of bumps 15. A bumped device is turned over and packaged as a Flip Chip (FC). A solder bump technology based on Controlled Collapse Chip Connection (C4) may be used for Direct Chip Attach (DCA) to conductive traces on a package or circuit board. The circuit board may be a ceramic substrate, Printed Wiring Board (PWB), flexible circuit, or a silicon substrate. Bumping a device also reduces the resistance and inductance in the I/Os thus significantly improving performance.

A high performance device, such as a microprocessor, an Application Specific Integrated Circuit (ASIC), a Field Programmable Gate Array (FPGA), or a System-on-a-Chip (SOC), may have about 600 to 7000 I/Os so the I/Os need to be scaled down to limit die size. Wirebonding may involve a pitch of less than 60 microns using wires with a diameter of less than 25 microns with ball bonds of less than 40 microns. Bumping may involve bumps with a diameter of about 45 to 90 microns and a pitch of about 125 to 300 microns.

Power management and thermal management become very critical when wire leads or bumps are scaled down. I/Os may fail if junction temperature exceeds 100 to 125 degrees C. or current density exceeds 150 to 425 milliamperes per I/O. Electromigration or thermomigration can increase resistance by over 2 orders of magnitude before finally resulting in an open circuit. Elevated temperatures can also cause inter-diffusion of metals. The resultant intermetallic alloys are brittle and may be susceptible to stress cracking. A mismatch in the Coefficient of Thermal Expansion (CTE) can result in large shear stresses on a wire lead or bump. For example, solder has a CTE of about 30 ppm/degree C. compared with about 7 ppm/degree C. for a ceramic substrate and about 5 ppm/degree C. for a Silicon substrate. A wire lead or bump may fail from thermal shock if the thermal ramp rate exceeds about 15 to 20 degrees C./minute. Thermal cycling at lower thermal ramp rates may also cause a wire lead or bump to crack due to fatigue induced by elastic deformation or creep deformation.

Thus, the failure of I/Os, especially the power I/Os, due to high currents and high temperatures is a major concern.

BRIEF DESCRIPTION OF THE DRAWINGS

FIG. 1a is an illustration of a plain view of a prior art bump.

FIG. 1b is an illustration of a cross-sectional view of a prior bump.

FIG. 2b is an illustration of cross-sectional view showing the formation of an opening over a bond pad in the device of FIG. 2a.

DETAILED DESCRIPTION OF THE PRESENT INVENTION

The present invention are novel ball limiting metallurgies (BLM) for input/outputs (I/Os) for devices and their methods of fabrication. In the following description numerous specific details such as specific materials, dimensions, and processes are set forth in order to provide a thorough understanding of the present invention. One skilled in the art, however, will realize that the invention may be practiced without these specific details. In other instances, well-know semiconductor equipment and processes have not been described in particular detail so as to avoid unnecessarily obscuring the present invention.

The present invention are a novel barrier layer metals or ball limiting metallurgy (BLM) for input/outputs to a device such as semiconductor devices. According to an embodiment of the present invention an input/output device includes a bond pad having a ball limiting metallurgy (BLM) formed thereon and a bump on the BLM. According to a first embodiment of the present invention the ball limiting metallurgy (BLM) comprises a first alloy film comprising nickel-vanadium-nitrogen. According to a second embodiment of the present invention, the ball limiting metallurgy (BLM) comprises a nickel niobium alloy film. By saturating a vanadium-titanium film with nitrogen or by utilizing a nickel-niobium film for the ball limiting metallurgy (BLM) the reliability lifetime of an input/output can be increased.

The input/output (I/O) of the present invention is ideally suited for providing the inputting and outputting of electrical signals to a semiconductor device or integrated circuit such as a microprocessor, memory, application specific integrated circuit (ASIC), field programmable gate arrays (FPGA) and especially where a large number of I/Os are required (e.g., 600–7000 I/Os).

Figure 2A:
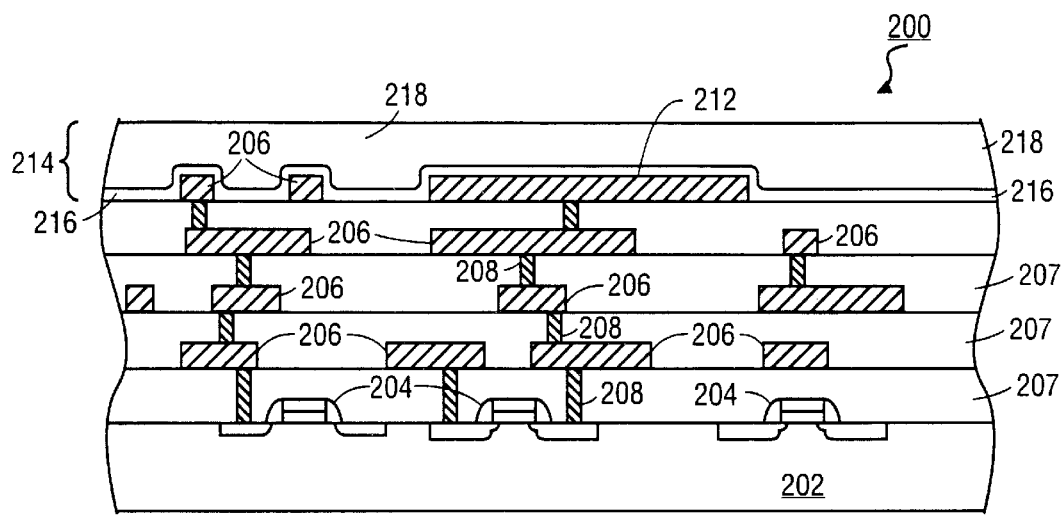
FIG. 2a is an illustration of a cross-sectional view of a portion of semiconductor device.

An example of a portion of typical semiconductor device or integrated circuit 200 is shown in FIG. 2a. Device 200 includes a semiconductor substrate such as a silicon substrate 202 having a plurality of active features 204 such as transistors and capacitors formed thereon. The active features 204 are coupled together into functional circuits through multiple levels of interconnects 206 isolated from one another by interlayer dielectrics (ILD) 207. Electrical contacts or vias 208 electrically couple the different levels of interconnects through ILD 207. Metal interconnects are typically formed of a low resistance metal such as aluminum, aluminum doped with copper and copper. Contacts and vias 206 are typically formed with tungsten but can formed with other materials such as copper.

The upper most level of metalization includes interconnects 206 and bond pads 212. Bond pads (or landing pads) 212 are widened portions of the upper most level of metalization to which electrical contact to external devices are made to semiconductor device 200.

The upper most level of metalization is blanket covered with a passivation layer 214 which act as a barrier to moisture, ions, and/or contaminants. A typical passivation layer 214 includes a lower hermetic silicon nitride layer 216 to provide hermetic sealing of device 200 and an upper polyimide layer 218 for providing scratch protection.

Figure 2B:
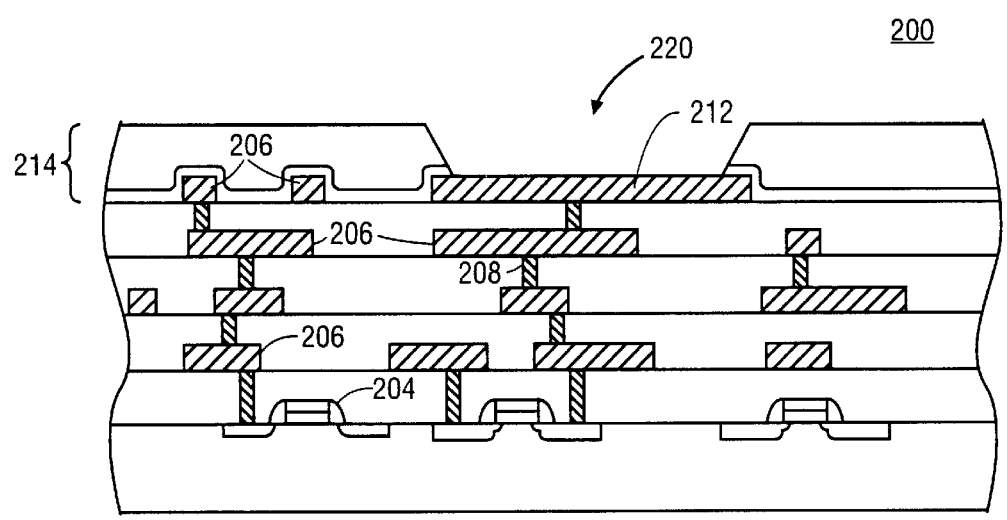

In a method of forming an input/output in accordance with the present invention an opening 220 is formed through passivation layer 214 as shown in FIG. 2b to expose a portion of bond pad 212. Opening 220 can be formed utilizing a photoresist layer and well-know photolithography and etching techniques. Alternatively, opening 220 can be formed in passivation layer 214 by utilizing a photo definable polyimide film 218.

Figure 2C:
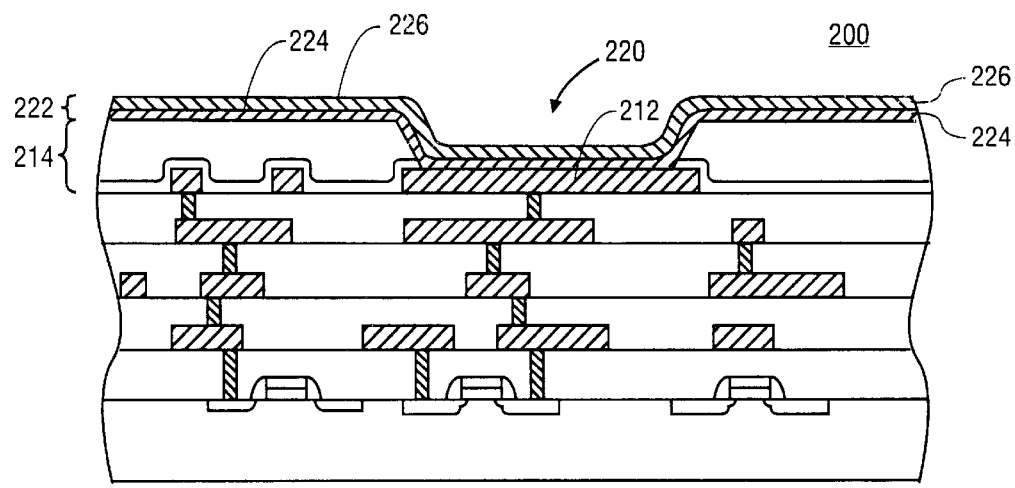
FIG. 2c is an illustration of a cross-sectional view showing a formation of a ball limiting metallurgy (BLM) on a device of FIG. 2b.

Next, a ball limiting metallurgy (BLM) is blanket deposited over passivation film 218 and into opening 220 and onto bond pad 212 as shown in FIG. 2c. In an embodiment of the present invention the ball limiting metallurgy (BLM) 222 layer includes a lower adhesion layer 224 which provides good adhesion to bond pad 212 and passivation layer 214. The lowered adhesion layer 224 maybe formed from titanium (Ti) with a thickness of about 200–1500 Å. Other possible metals for adhesion layer 224 include but are not limited to titanium tungsten (TiW), tantalum (Ta), or chromium (Cr). Any well-known techniques such as sputtering can be used to deposit adhesion layer 224.

According to the present invention the ball limiting metallurgy (BLM) includes an upper layer 226 which is wettable by solder. According to a first embodiment of the present invention the upper lay 226 is a film consisting of nickel, vanadium, and nitrogen. Nitrogen is added to the film to lock the vanadium with nitrogen so that it cannot react with oxygen and degrade the reliability of the BLM. The upper layer 226 includes a suitable amount of nitrogen to sufficiently prevent the oxidation of vanadium in the upper film 226. In an embodiment of the present invention the upper film includes as much nitrogen as vanadium. In an embodiment of the present invention the upper film 226 includes about 8 atomic percent vanadium, about 8 atomic percent nitrogen, and the remainder nickel. The upper nickel-vanadium-nitrogen alloy film 226 can have a thickness between 1000–4000 Å.

A suitable nickel-vanadium-nitrogen alloy film 226 can be formed by reactive sputtered utilizing a nickel-vanadium target in an ambient containing nitrogen. In an embodiment of the present invention the nickel-vanadium-nitrogen film 226 is formed by magnetic sputtering with Argon (Ar) from a nickel-vanadium target in a magnetron sputter chamber, such as manufactured by Material Research Corporation (MRC) while nitrogen gas ($N_2$) is fed into the chamber. No oxygen is present in the chamber during sputtering. Nitrogen ($N_2$) gas is fed in at a rate sufficient to saturate the deposited film 226 with nitrogen. In an embodiment of the present invention $N_2$ is fed into a magnetron sputter chamber at a rate between 15–30 sccms. By nitridizing a nickel-vanadium alloy film it is thought that the nitrogen acts as a lock to prevent the vanadium from defusing to the surface and oxidizing which would increase the resistance of the BLM layer and create reliability issues.

In the second embodiment of the present invention the upper layer of 226 of BLM 222 is a nickel-niobium (Ni—Nb) alloy. In an embodiment of the present invention the upper layer 226 is a nickel-niobium (Ni—Nb) alloy having approximately 10 atomic percent niobium (Nb) with the remainder nickel (Ni). A nickel-niobium (Ni—Nb) alloy having a thickness between 1000–4000 Å can be used. A suitable nickel-niobium (Ni—Nb) film can be formed by any well-known method such as by sputtering from a nickel-niobium (Ni—Nb) target. A nichel-niobium (Ni—Nb) upper film 226 has shown good reliability.

The BLM 222 acts a diffusion barrier to metals. Depending upon the type of metallurgy selected for bumps and the BLM, additional layers may be inserted between the adhesion 224 and the upper layer 226. The intermediate layer used must have good adhesion to both the adhesion layer 224 and the upper layer 226.

Figure 2D:
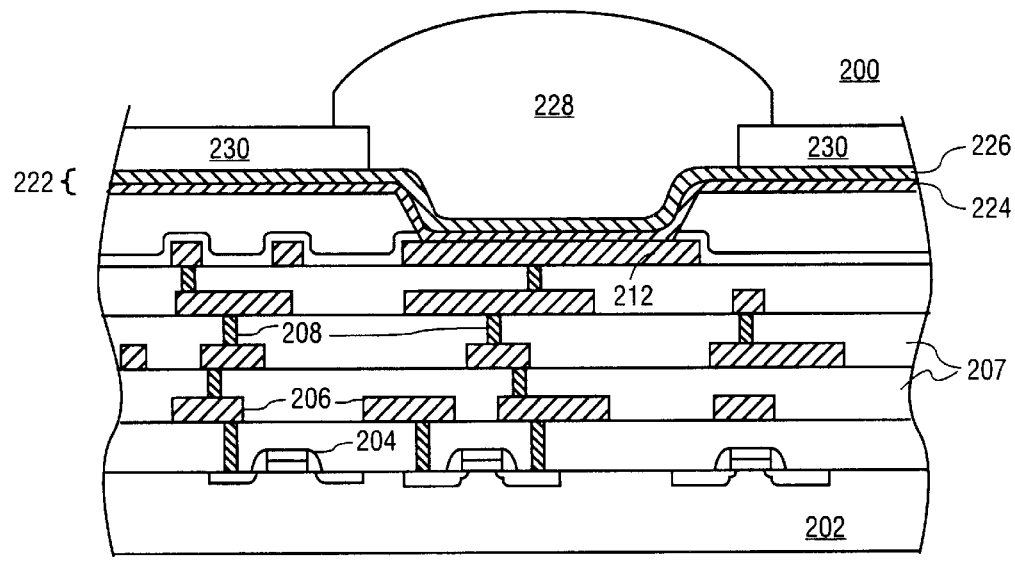
FIG. 2d is an illustration of a cross-section view showing the formation of a bump on the device of FIG. 2c.

Next, a bump 228 is formed on BLM layer 222 over bond pad 212. A bump 228 can be formed, by for example, forming a photoresist mask 230 having an opening to expose the BLM layer over a bond pad as shown in FIG. 2d. Solder is then electroplated onto the BLM 222 as shown in FIG. 2d. The solder forms a mushroom shape as shown in FIG. 2d. The solder may be from lead tin (Pb—Sn) or lead indium (Pb—In). Tin prevents oxidation and strengthens the bonding to the BLM 222. The use of nickel (Ni) in the upper 226 BLM layer 222 enables the plating of lead.

Figure 2E:
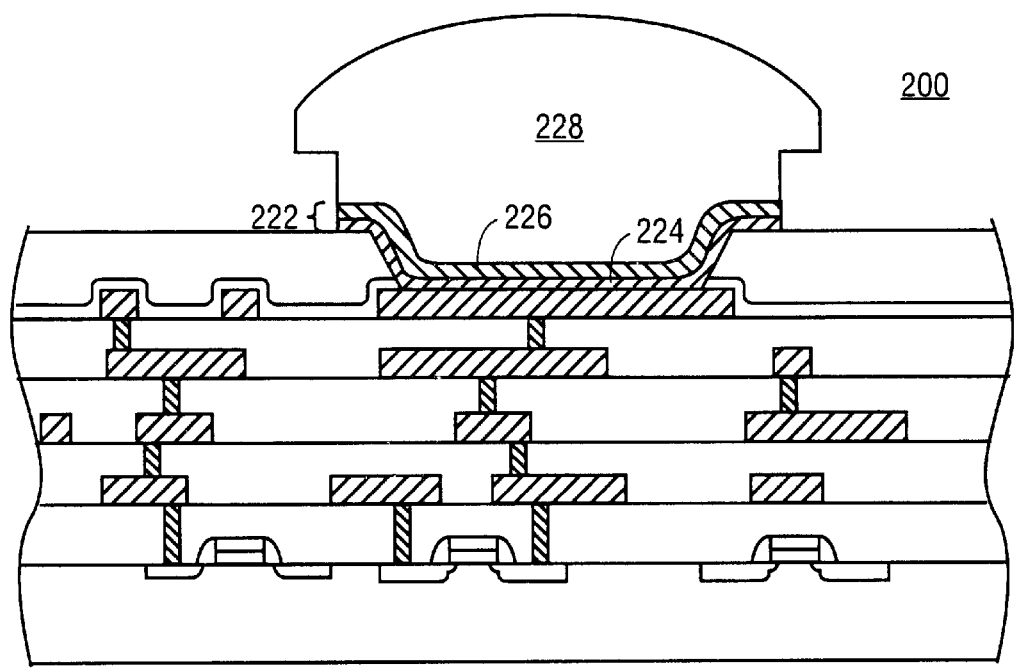
FIG. 2e is an illustration of a cross-sectional view showing the removal of exposed portions of the BLM layer from the device of FIG. 2d.

Next, the photoresist mask 230 is removed and excess portions of BLM 222 which are not covered by solder ball 228 are removed by etching as shown in FIG. 2e.

Figure 2F:
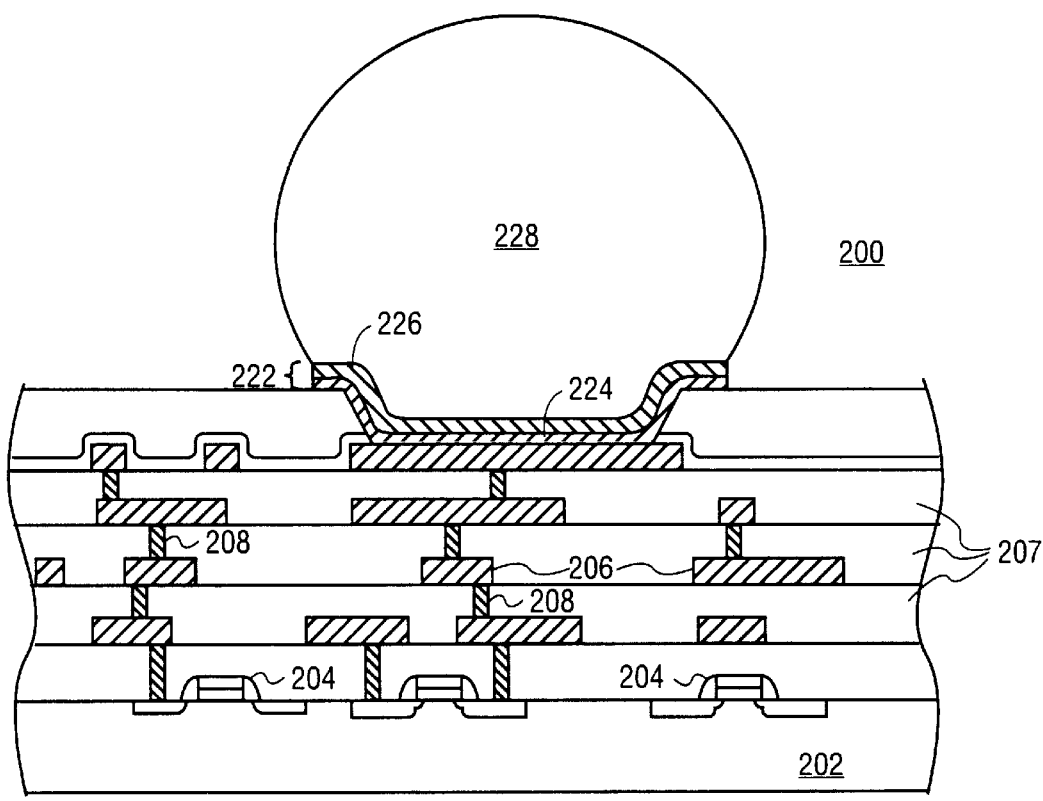
FIG. 2f is an illustration of a cross-sectional view showing the reflow of the bump on the device of FIG. 2e.

Next, the substrate is heated in an oven or furnace to fallow the solder into a solder bump 228 as shown in FIG. 2f. The melting temperature of the solder in bump 228 depends upon the types of metal selected on their relative concentrations. For example, a high lead solder such as 95 Pb/5 Sn by weight reflows at about 300–360° C. while in an eutectic solder such as 37 Pb/63 Sn reflows at about 180–240° C. The reflowed bump 228 can be connected to a corresponding bump on a package or board. The bump on the package or board is formed from Tin (Sn) or solder with a relatively low melting temperature such as 160° C. so that bump 228 on the chip will not reflow during the chip attachment process.

The novel input/outputs of the present invention and their methods of fabrication enables the fabrication of a large number (between 600–7000 I/Os) across the upper surface of device 200. The I/Os of the present invention can support current density of between 200–300 milli-amps per bump, and can withstand operating temperature between 110–120°

C. without reliability issues. The input/output of the present invention enables the fabrication of semiconductor devices which require large numbers of I/Os.

I claim:

1. An input/output for a device comprising:
   a bond pad;
   a ball limiting metallurgy (BLM) on said bond pad comprising a first alloy film comprising nickel-vanadium-nitrogen; and
   a bump on said ball limiting metallurgy (BLM).

2. The input/output of claim 1 wherein said first alloy film includes as much nitrogen by atomic percent as vanadium.

3. The input/output of claim 1 wherein said first alloy film comprises a sufficient amount of nitrogen to prevent oxidation of said vanadium.

4. The input/output of claim 1 wherein said first alloy film consists of approximately 8 atomic percent nitrogen.

5. The input/output of claim 1 wherein said first alloy film is between 1000–4000 Å thick.

6. The input/output of claim 1 wherein said ball limiting metallurgy (BLM) further comprises a second film wherein said second film comprises titanium and said second film is formed between said first film and second bond pad.

7. The input/output of claim 1 wherein said bump is a solder bump.

8. The input/output of claim 7 wherein said solder bump is Pb—Sn.

9. An input/output for a device comprising:
   a bond pad;
   a ball limiting metallurgy (BLM) on said bond pad comprising a first film comprising a nickel-niobium alloy; and
   a bump on said nickel-niobium alloy film of said ball limiting metallurgy (BLM).

10. The input/output of claim 9 wherein said nickel-niobium alloy comprises approximately 10 atomic percent niobium.

11. The input/output of claim 9 wherein said first film has a thickness between 1000–04000 Å.

12. The input/output of claim 9 further comprising a second film comprising titanium wherein said second film is formed between said first film and said bond pad.

13. The input/output of claim 9 wherein said bump is a solder bump.

14. The input/output of claim 13 wherein said solder bump is a Pb—Sn solder bump.

* * * * *

UNITED STATES PATENT AND TRADEMARK OFFICE
CERTIFICATE OF CORRECTION

PATENT NO.    : 6,521,996 B1  
DATED         : February 18, 2003  
INVENTOR(S)   : Seshan It is certified that error appears in the above-identified patent and that said Letters Patent is hereby corrected as shown below:

<u>Column 4,</u>
Line 27, delete "nichel", insert -- nickel --.

Signed and Sealed this

Thirtieth Day of September, 2003

JAMES E. ROGAN  
*Director of the United States Patent and Trademark Office*